United States Patent
Terada et al.

(10) Patent No.: US 8,437,061 B2
(45) Date of Patent: May 7, 2013

(54) PIEZOELECTRIC ACTUATOR, OPTICAL REFLECTION ELEMENT USING THE SAME AND PIEZOELECTRIC DRIVER

(75) Inventors: Jirou Terada, Osaka (JP); Shinsuke Nakazono, Osaka (JP); Shigeo Furukawa, Osaka (JP)

(73) Assignee: Panasonic Corporation, Osaka (JP)

( * ) Notice: Subject to any disclaimer, the term of this patent is extended or adjusted under 35 U.S.C. 154(b) by 601 days.

(21) Appl. No.: 12/673,238

(22) PCT Filed: Aug. 20, 2008

(86) PCT No.: PCT/JP2008/002246
§ 371 (c)(1),
(2), (4) Date: Feb. 12, 2010

(87) PCT Pub. No.: WO2009/028152
PCT Pub. Date: Mar. 5, 2009

(65) Prior Publication Data
US 2011/0122471 A1  May 26, 2011

(30) Foreign Application Priority Data

Aug. 27, 2007 (JP) .................................. 2007-219509
Jan. 31, 2008 (JP) .................................. 2008-020471

(51) Int. Cl.
*G02B 26/08* (2006.01)
*H01L 41/00* (2006.01)

(52) U.S. Cl.
USPC ...................... 359/199.1; 359/199.4; 310/311

(58) Field of Classification Search .... 359/198.1–199.2, 359/199.4, 200.6, 200.8, 221.2, 224.1–224.2; 310/311, 316.01, 323.01, 330, 331
See application file for complete search history.

(56) References Cited

U.S. PATENT DOCUMENTS

| | | | |
|---|---|---|---|
| 5,962,953 A | 10/1999 | Sasaki | |
| 2006/0018049 A1 | 1/2006 | Mizuno | |
| 2008/0143450 A1* | 6/2008 | Matsumoto et al. | 331/116 R |

FOREIGN PATENT DOCUMENTS

| JP | 2003-089206 A | 3/2003 |
|---|---|---|
| JP | 2003-089206 A | 3/2003 |
| JP | 2005-148459 A | 6/2005 |
| JP | 2005-148459 A | 6/2005 |
| JP | 2006-039066 A | 2/2006 |
| JP | 2007-171989 A | 7/2007 |

OTHER PUBLICATIONS

International Search Report for Application No. PCT/JP2008/002246, Sep. 16, 2008, Panasonic Corporation.

* cited by examiner

*Primary Examiner* — James Phan
(74) *Attorney, Agent, or Firm* — RatnerPrestia

(57) ABSTRACT

A first oscillating portion is provided with a first piezoelectric element having a first drive electrode. A second oscillating portion has a central axis different from that of the first oscillating portion and is provided with a second piezoelectric element having a second drive electrode. The first drive electrode and the second drive electrode are connected together.

6 Claims, 13 Drawing Sheets

US 8,437,061 B2

PIEZOELECTRIC ACTUATOR, OPTICAL REFLECTION ELEMENT USING THE SAME AND PIEZOELECTRIC DRIVER

THIS APPLICATION IS A U.S. NATIONAL PHASE APPLICATION OF PCT INTERNATIONAL APPLICATION PCT/JP2008/002246.

TECHNICAL FIELD

The present invention relates to a piezoelectric actuator, an optical reflection element using the same and a piezoelectric driver.

BACKGROUND ART

FIG. 18 shows a conventional optical reflection element using a piezoelectric actuator as disclosed in patent literature 1. This optical reflection element comprises mirror 1, oscillating portion 2 linked with mirror 1 for driving mirror 1 in the direction of X-axis, frame body 3 linked with oscillating portion 2 and surrounding oscillating portion 2 and mirror 1, oscillating portion 4 linked with frame body 3 for driving mirror 1 in the direction of Y-axis, and support base 5 linked with oscillating portion 4 and surrounding oscillating portion 4 and frame body 3.

Oscillating portions 2 and 4 generally have piezoelectric elements (not shown) to make them drive oscillating portions 2 and 4. These piezoelectric elements are provided in general with drive electrodes (not shown) independently formed thereon to drive these piezoelectric elements.

When light emanates on mirror 1, this optical reflection element can sweep the reflected light in the directions of X- and Y-axes by oscillating mirror 1 in a manner to project an image on a wall or a screen, for instance.

The conventional optical reflection element discussed above has a problem however, that it requires a large number of wiring traces for the electrodes, thereby impeding the production efficiency.

In other words, the conventional optical reflection element requires patterning of the electrically independent drive electrodes for each of oscillating portions 2 and 4 in order to drive them individually.

In addition, the element bears a plurality of wiring electrodes formed thereon since the wiring electrode is necessary for every one of these drive electrodes routed on the surfaces of oscillating portions 2 and 4. These wiring electrodes make the patterning very complex as the element is miniaturized, and they thus become a cause of hindering the production efficiency.

Patent Literature 1: Japanese Patent Unexamined Publication, No. 2005-148459

SUMMARY OF THE INVENTION

The present invention is to provide a piezoelectric actuator, an optical reflection element using the same and a piezoelectric driver having advantages of decreasing a number of wiring electrodes and improving production efficiency.

The piezoelectric actuator of the present invention comprises a first oscillating portion provided with a first piezoelectric element having a first drive electrode, and a second oscillating portion having a central axis different from that of the first oscillating portion and provided with a second piezoelectric element having a second drive electrode, wherein the first drive electrode and the second drive electrode are connected together.

By virtue of this configuration, the invention can decrease a number of wiring electrodes for the drive electrodes and make routing of the electrodes easier, thereby improving the productivity.

REFERENCE MARKS IN THE DRAWINGS

Figure 1:
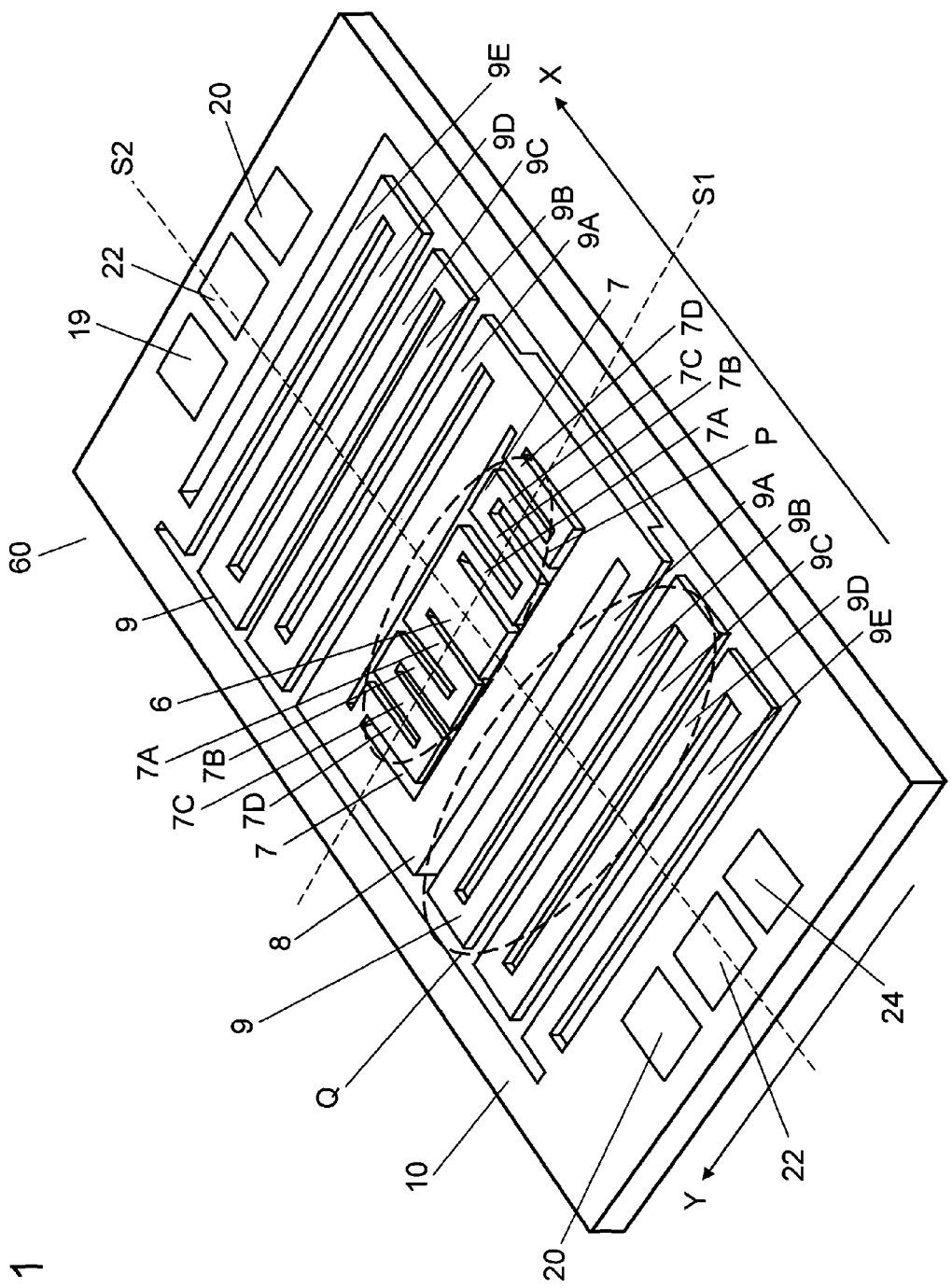
FIG. 1 is a perspective view of an optical reflection element according to a first exemplary embodiment of the present invention.

6 Mirror
7, 9 Oscillating portion
7A-7D and 9A-9E Oscillating blade
8 Frame body
10 Support base
11 Piezoelectric element
12 and 13 Monitor element
14 Silicon substrate
15 Silicon dioxide film
16 Ground electrode
17 Piezoelectric layer
18, 31, 32, 35 and 36 Drive electrode 18A, 21A, 23A, 31A, 32A, 33A, 35A and 36A Wiring electrode
19, 19A, 19B, 20, 22, 24 and 34 External electrode
25 and 26 Amplifier
27 and 28 Impedance element
29, 30, 37A and 37B Filter
38 and 39 Preamplifier
40 and 42 Saturation amplifier
41 and 43 Band-pass filter
44 Adder
45 Adder-combiner circuit
46 Light source
47 Incident light
48 Reflected light
49 Screen
50 Image
60 Optical reflection element
61 Drive unit
62 Drive controller unit
S1 and S2 Central axis

DETAILED DESCRIPTION OF PREFERRED EMBODIMENTS

First Exemplary Embodiment

Optical reflection element 60 according to this exemplary embodiment comprises mirror 6 and a pair of oscillating portions ("first oscillating portions") 7 linked with two side portions of mirror 6 in a manner to confront each other across mirror 6 as shown in FIG. 1. Optical reflection element 60 also comprises frame body 8 linked with these oscillating portions 7 and surrounding the perimeter of oscillating portions 7 and mirror 6, a pair of oscillating portions ("second oscillating portions") 9 linked with side portions of frame body 8 in a manner to confront each other across frame body 8, and support base 10 of a frame shape linked with these oscillating portions 9 and surrounding the perimeter of oscillating portions 9 and frame body 8.

According to this exemplary embodiment, oscillating portions 7 and 9 have different resonance frequencies with respect to each other, and a ratio of the frequencies is in a range of about 10 to 100. In the case of this exemplary embodiment, the resonant frequencies are set to about 10 kHz for oscillating portions 7 and about 200 Hz for oscillating portions 9.

Central axis S1 of oscillating portions 7 and central axis S2 of oscillating portions 9 are set different in their directions such that they intersect with each other. According to this exemplary embodiment, oscillating portions 7 have central axis S1 in parallel with the Y-axis and oscillating portions 9 have central axis S2 in parallel with the X-axis, and that these central axes S1 and S2 intersect at right angles at the center of gravity of mirror 6. The pair of oscillating portions 7 are symmetric with respect to central axis S2 of oscillating portions 9, and the pair of oscillating portions 9 are symmetric with respect to central axis 51 of oscillating portions 7.

In this exemplary embodiment, oscillating portions 7 have a meandering shape extending sinuously along the direction of Y-axis, and each of oscillating portions 7 comprises a plurality of oscillating blades ("first oscillating blades") 7A to 7D formed in parallel to the X-axis (i.e., perpendicular to central axis S1) and chained in a meandering manner in the same plane. Likewise, oscillating portions 9 have a meandering shape extending sinuously along the direction of X-axis, and each of oscillating portions 9 comprises a plurality of oscillating blades ("second oscillating blade") 9A to 9E formed in parallel to the Y-axis (i.e., perpendicular to central axis S2) and chained in the meandering manner in the same plane.

Figure 2:
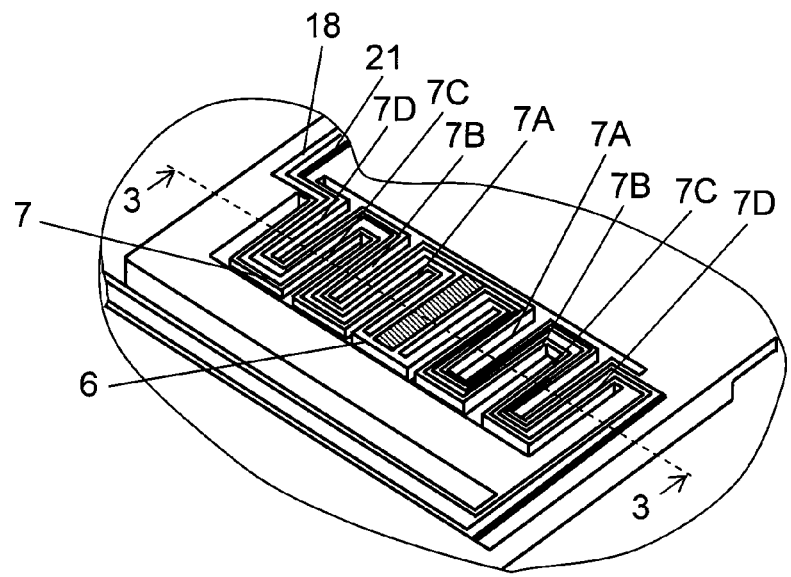
FIG. 2 is a perspective view of a portion marked P in FIG. 1.
Figure 3:
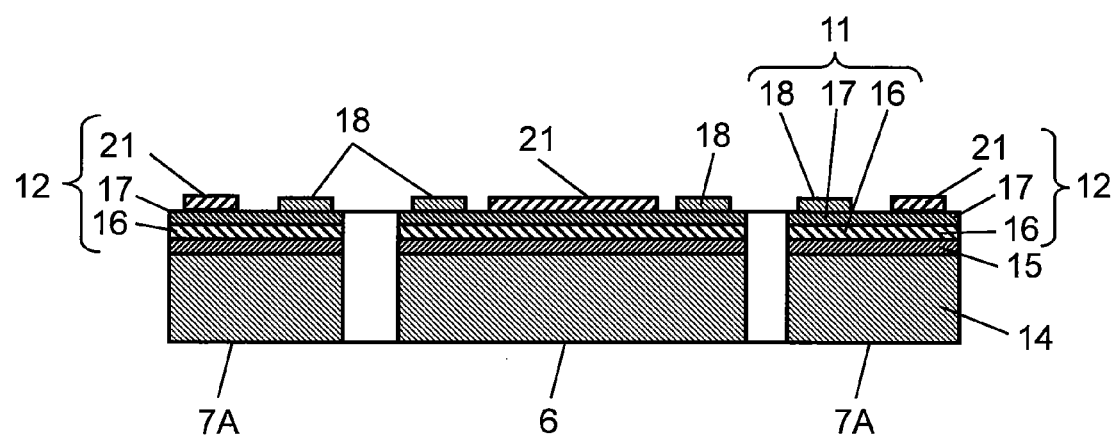
FIG. 3 is a sectional view taken along a line 3-3 in FIG. 2.

FIG. 2 is a perspective view showing a portion marked P (i.e., oscillating portions 7) in FIG. 1 and FIG. 3 is a sectional view taken along a line 3-3 of that portion. As shown in these figures, the plurality of oscillating blades 7A to 7D composing oscillating portions 7 are each comprised of piezoelectric element ("first piezoelectric element") 11 and monitor element ("first monitor element") 12.

Piezoelectric element 11 in each oscillating portion 7 comprises ground electrode 16 formed in common to all oscillating portions 7 and 9 on silicon substrate 14 serving as a base provided with silicon dioxide film 15 between them, piezoelectric layer 17 formed in common to all oscillating portions 7 and 9 on ground electrode 16, and drive electrode ("first drive electrode) 18 formed on piezoelectric layer 17, as shown in FIG. 3. Drive electrode 18 has such a configuration that portions formed on respective surfaces of the plurality of oscillating blades 7A to 7D of oscillating portion 7 are continuously connected, as shown in FIG. 2. Ground electrode 16 is connected to external electrode 20 shown in FIG. 1. Oscillating portions 7 provided with piezoelectric elements 11 having drive electrodes 18 constitute the piezoelectric actuator that has central axis S2.

Monitor element 12 in each oscillating portion 7 comprises ground electrode 16 and piezoelectric layer 17 formed in common to piezoelectric element 11 on silicon substrate 14 provided with silicon dioxide film 15 between them, and monitor electrode ("first monitor electrode") 21 on piezoelectric layer 17, as shown in FIG. 3. Monitor electrode 21 has such a configuration that portions formed on respective surfaces of the plurality of oscillating blades 7A to 7D of oscillating portion 7 are continuously connected, as shown in FIG. 2.

As described, a set of two electrodes consisting of drive electrode 18 and monitor electrode 21 are routed on individual oscillating blades 7A to 7D constituting oscillating portion 7. Monitor electrode 21 is further routed through oscillating portion 9 as wiring electrode 21A of a small width formed thereon as shown in FIG. 4 and FIG. 5, and connected to external electrode 22 of FIG. 1.

Figure 4:
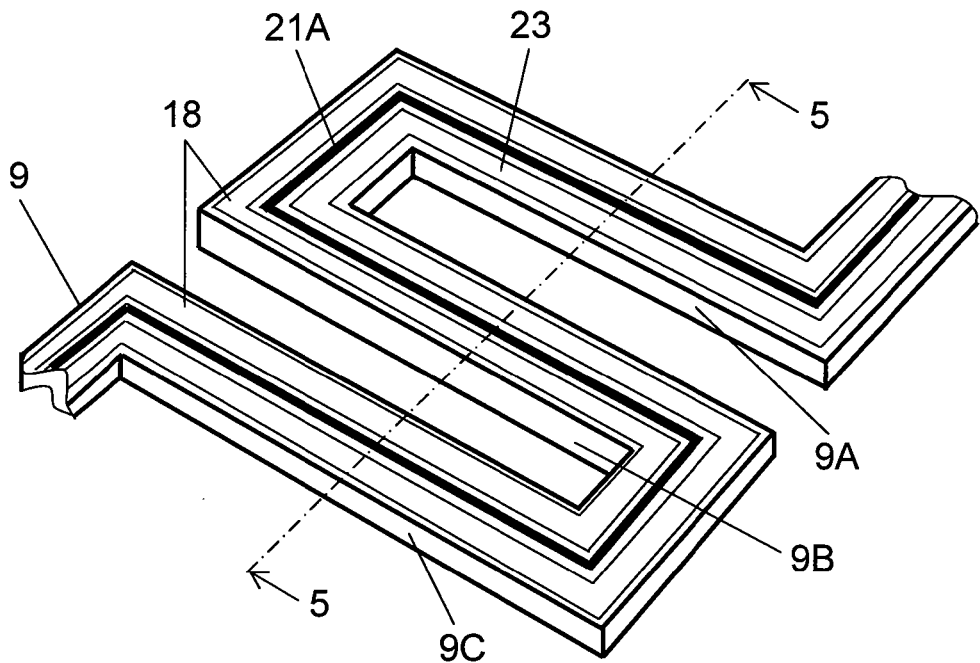
FIG. 4 is a perspective view of a portion marked Q in FIG. 1.
Figure 5:
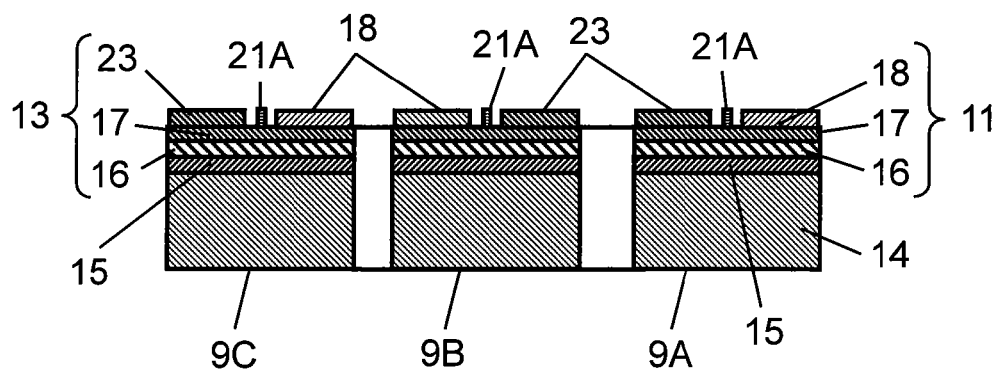
FIG. 5 is a sectional view taken along a line 5-5 in FIG. 4.

FIG. 4 is a perspective view showing a portion marked Q (i.e., oscillating portion 9) in FIG. 1 and FIG. 5 is a sectional view taken along a line 5-5 of that portion. As shown in these figures, the plurality of oscillating blades 9A to 9E composing oscillating portions 9 are each comprised of piezoelectric element ("second piezoelectric element") 11 and monitor element ("second monitor element") 13.

Similar to oscillating portion 7, piezoelectric element 11 in each oscillating portion 9 comprises ground electrode 16 formed in common to all oscillating portions 7 and 9 on silicon substrate 14 serving as the base provided with silicon dioxide film 15 between them, piezoelectric layer 17 formed in common to all oscillating portions 7 and 9 on ground electrode 16, and drive electrode ("second drive electrode) 18 formed on piezoelectric layer 17, as shown in FIG. 5. Drive electrode 18 has a configuration, as shown in FIG. 4, that portions formed on respective surfaces of the plurality of oscillating blades 9A to 9E of oscillating portion 9 are continuously connected. Drive electrode 18 is also connected with drive electrode 18 routed from oscillating portion 7, and it is connected to external electrode 19 shown in FIG. 1. Oscillating portions 9 provided with piezoelectric elements 11 having drive electrodes 18 constitute the piezoelectric actuator that has central axis S1.

Monitor element 13 in each oscillating portion 9 comprises ground electrode 16 and piezoelectric layer 17 formed in common to piezoelectric element 11 on silicon substrate 14 provided with silicon dioxide film 15 between them, and monitor electrode ("second monitor electrode") 23 on piezoelectric layer 17, as shown in FIG. 5. Monitor electrode 23 has such a configuration that portions formed on respective surfaces of the plurality of oscillating blades 9A to 9E of oscillating portion 9 are continuously connected, as shown in FIG. 4, and it is connected to external electrode 24 shown in FIG. 1.

According to this exemplary embodiment as described above, monitor electrode 21 provided in oscillating portion 7 and monitor electrode 23 provided in oscillating portion 9 are electrically independent of each other. There are thus a set of three electrodes consisting of drive electrode 18, monitor electrode 23 and wiring electrode 21A of a small width in communication with monitor electrode 21 of oscillating portion 7, which are routed on the plurality of oscillating blades 9A to 9E of oscillating portion 9, as shown in FIG. 5.

Figure 6:
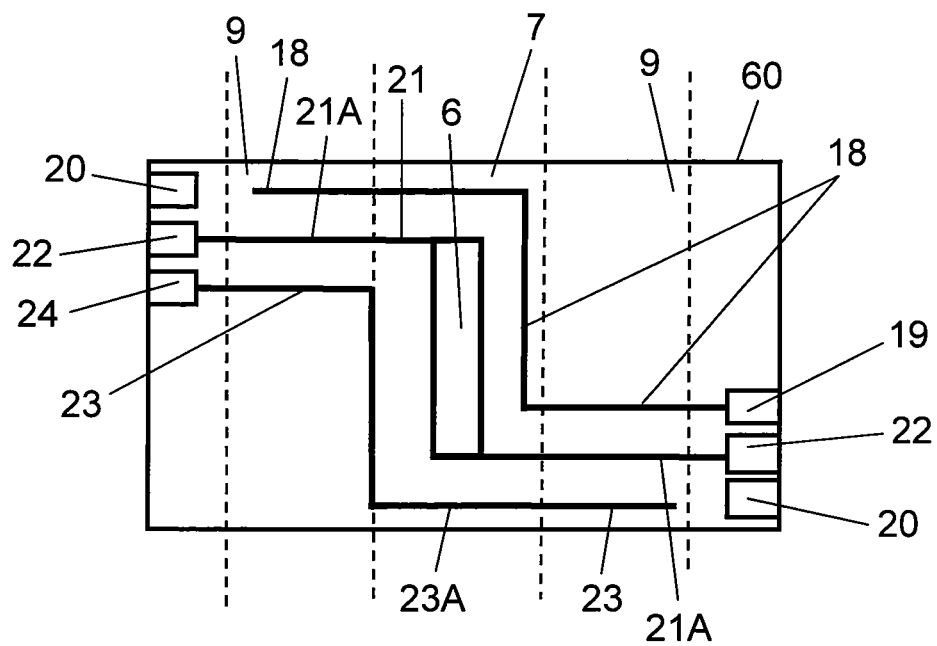
FIG. 6 is a schematic diagram showing a wiring pattern of the optical reflection element according to the same exemplary embodiment.

FIG. 6 is a diagram showing schematically an electrode pattern of the optical reflection element according to the exemplary embodiment discussed above. In FIG. 6, optical reflection element 60 is typified by showing one oscillating portion 7 provided with mirror 6 in the center, and two oscillating portions 9 sandwiching oscillating portion 7 between them. Driving electrode 18 is shown as a single electrode disposed on oscillating portions 7 and 9, and connected to a common end of external electrode 19. Monitor electrode 21 disposed on oscillating portion 7 is independent of monitor electrode 23, and it is shown as being routed on oscillating portion 9 and connected to two external electrodes 22. Monitor electrodes 23 disposed on the pair of oscillating portions 9 are independent of monitor electrode 21, and they are shown as being linked with wiring electrode 23A routed on oscillating portion 7 and connected to a common end of external electrode 24.

As described, there are drive electrode 18 and monitor electrode 21 provided on each of oscillating blades 7A to 7D of oscillating portion 7 in the manner as shown in FIG. 3. Similarly, drive electrode 18 and monitor electrode 23 are provided in positions to sandwich wiring electrode 21A of monitor electrode 21 on each of oscillating blades 9A to 9E of oscillating portion 9 in the manner as shown in FIG. 5.

In this exemplary embodiment, although common drive electrode 18 was described as having one end terminated open as shown in FIG. 6, it could be so altered that this end is also connected to another external electrode provided separately.

In addition, although this exemplary embodiment was described as using silicon substrate 14 for the base, it could be substituted by a plate of other material such as magnesium oxide (MgO) or stainless steel. Materials that can be named typically include platinum for ground electrode 16, gold for drive electrode 18 and monitor electrodes 21 and 23, and lead zirconate titanate ($Pb(Zr_x,Ti_{1-x})O_3$, where x=0.525) for piezoelectric layer 17. These electrode materials can be formed into thin films by such methods as vacuum deposition, sol-gel process, chemical vapor deposition, sputtering and the like.

Figure 7:
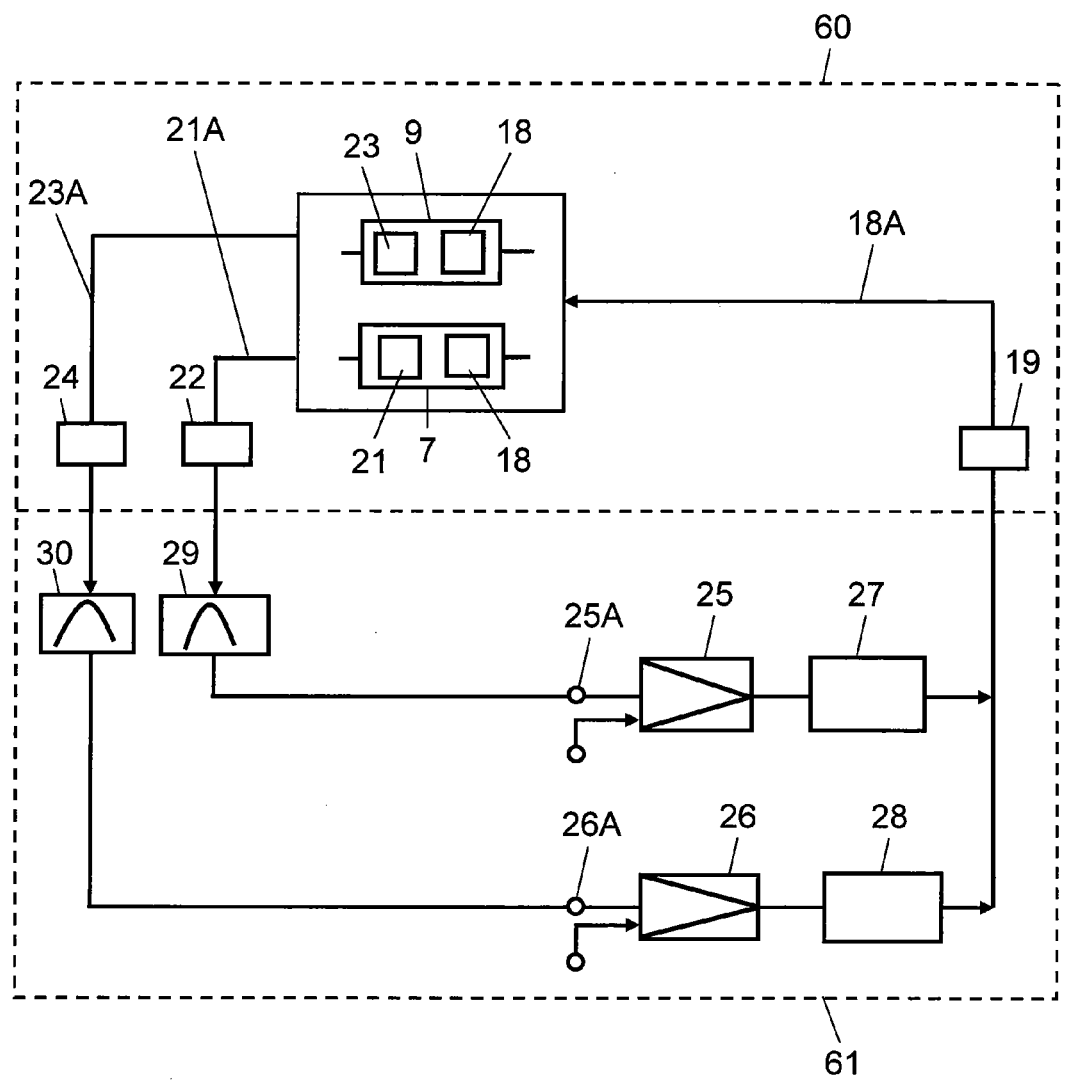
FIG. 7 is a block diagram showing a configuration of a piezoelectric driver according to the same exemplary embodiment.

Referring to FIG. 7, description is provided next of a configuration of the piezoelectric driver according to this exemplary embodiment. FIG. 7 is a block diagram showing the configuration of the piezoelectric driver according to one exemplary embodiment of this invention.

The piezoelectric driver of this exemplary embodiment comprises optical reflection element 60 shown in FIG. 1 and drive unit 61 for inputting a resonance driving signal to each of oscillating portions 7 and 9 of optical reflection element 60.

Drive unit 61 of this exemplary embodiment has amplifiers 25 and 26 disposed in parallel to each other. Amplifier 25 is connected with impedance element 27, and amplifier 26 is connected with impedance element 28. A wiring connecting amplifier 25 to impedance element 27 and another wiring connecting amplifier 26 to impedance element 28 are connected together and wired to external electrode 19 of optical reflection element 60 shown in FIG. 1. Common wiring electrode 18A is then routed on optical reflection element 60 for making connection from external electrode 19 to drive electrodes 18 on oscillating portions 7 and 9.

On the other hand, monitor electrode 21 for detecting oscillation of oscillating portion 7 is routed to external electrode 22 through wiring electrode 21A on optical reflection element 60, and connected from external electrode 22 to amplifier 25 by way of filter 29 in drive unit 61. Likewise, monitor electrode 23 for detecting oscillation of oscillating portion 9 is routed to external electrode 24 through wiring electrode 23A on optical reflection element 60, and connected from external electrode 24 to amplifier 26 by way of filter 30 in drive unit 61.

The optical reflection element of this exemplary embodiment operates in a manner, which is described next with reference to FIG. 7. First, an electric signal (i.e., an ac voltage) for driving oscillating portion 7 is input to input terminal 25A of amplifier 25 as shown in FIG. 7, and it is amplified. Similarly, another electric signal (i.e., an ac voltage) for driving oscillating portion 9 is input to input terminal 26A of amplifier 26, and it is amplified.

In this exemplary embodiment, the electric signal input to oscillating portion 7 for driving it to resonate has an oscillation frequency specific to this oscillating portion 7. The electric signal input to oscillating portion 9 for driving it to resonate also has an oscillation frequency specific to this oscillating portion 9. These electric signals can hence drive oscillating portions 7 and 9 efficiently and produce deflections of a large magnitude.

The electric signals discussed above are combined together after passing them through respective impedance elements 27 and 28 such as resistors, and supplied to external electrode 19 of optical reflection element 60. This composite electric signal is delivered from external electrode 19 to drive electrodes 18 on oscillating portions 7 and 9 through a single trace of wiring electrode 18A (refer to FIG. 6) and drives both of piezoelectric elements 11 individually.

In other words, oscillating portion 9 is oscillated vertically (i.e., a direction perpendicular to the plane of the element) by positive and negative potentials of the alternating voltage supplied from common drive electrode 18. This oscillation causes the lower side (i.e., one side linked to oscillating portion 9) of frame body 8 shown in FIG. 1 to vibrate vertically (i.e., the direction perpendicular to the plane of the element), and brings mirror 6 into a rotational motion about central axis S2 while keeping the center of mirror 6 a stationary point. In this exemplary embodiment, the central axis S2 of oscillating portion 9 coincides with the rotational axis of mirror 6 driven by oscillating portion 9.

In a manner similar to the above, oscillating portion 7 is oscillated vertically by the positive and negative potentials of the alternating voltage supplied from common drive electrode 18. This oscillation causes the one side (i.e., the side linked to oscillating portion 7) of mirror 6 shown in FIG. 1 to vibrate vertically (i.e., the direction perpendicular to the plane of the element), and brings mirror 6 into a rotational motion about central axis S1 while keeping the center of mirror 6 a stationary point. The central axis S1 of oscillating portion 7 also coincides with the rotational axis of mirror 6 driven by oscillating portion 7.

Monitor electrode 21 disposed on oscillating portion 7 detects the deflection of oscillating portion 7 as an electric signal, which in turn is delivered through wiring electrode 21A to the outside from external electrode 22. Monitor electrode 23 disposed on oscillating portion 9 also detects the deflection of oscillating portion 9 as an electric signal, which is delivered through wiring electrode 23A to the outside from external electrode 24.

The electric signal delivered from external electrode 22 is taken through filter 29 in drive unit 61, and is again input to input terminal 25A of amplifier 25, as shown in FIG. 7. Likewise, the electric signal delivered from external electrode 24 is taken through filter 30 in drive unit 61, and is again input to input terminal 26A of amplifier 26.

As discussed, this configuration can bring the optical reflection element into self-excited oscillation by feeding the electric signals output from monitor electrodes 21 and 23 back to drive electrodes 18 on the individual piezoelectric elements 11 of oscillating portions 7 and 9.

Impedance elements 27 and 28 here may be comprised of reactive elements such as capacitors, coils or combinations thereof besides the resistors noted above.

It shall be understood that the electric signal input to external electrode 19 may be made by combining three or more signals though only two electric signals are discussed in the above exemplary embodiment.

As described, it becomes possible according to this exemplary embodiment to decrease a number of wiring electrodes for drive electrodes 18 and to improve the productivity.

Figure 18:
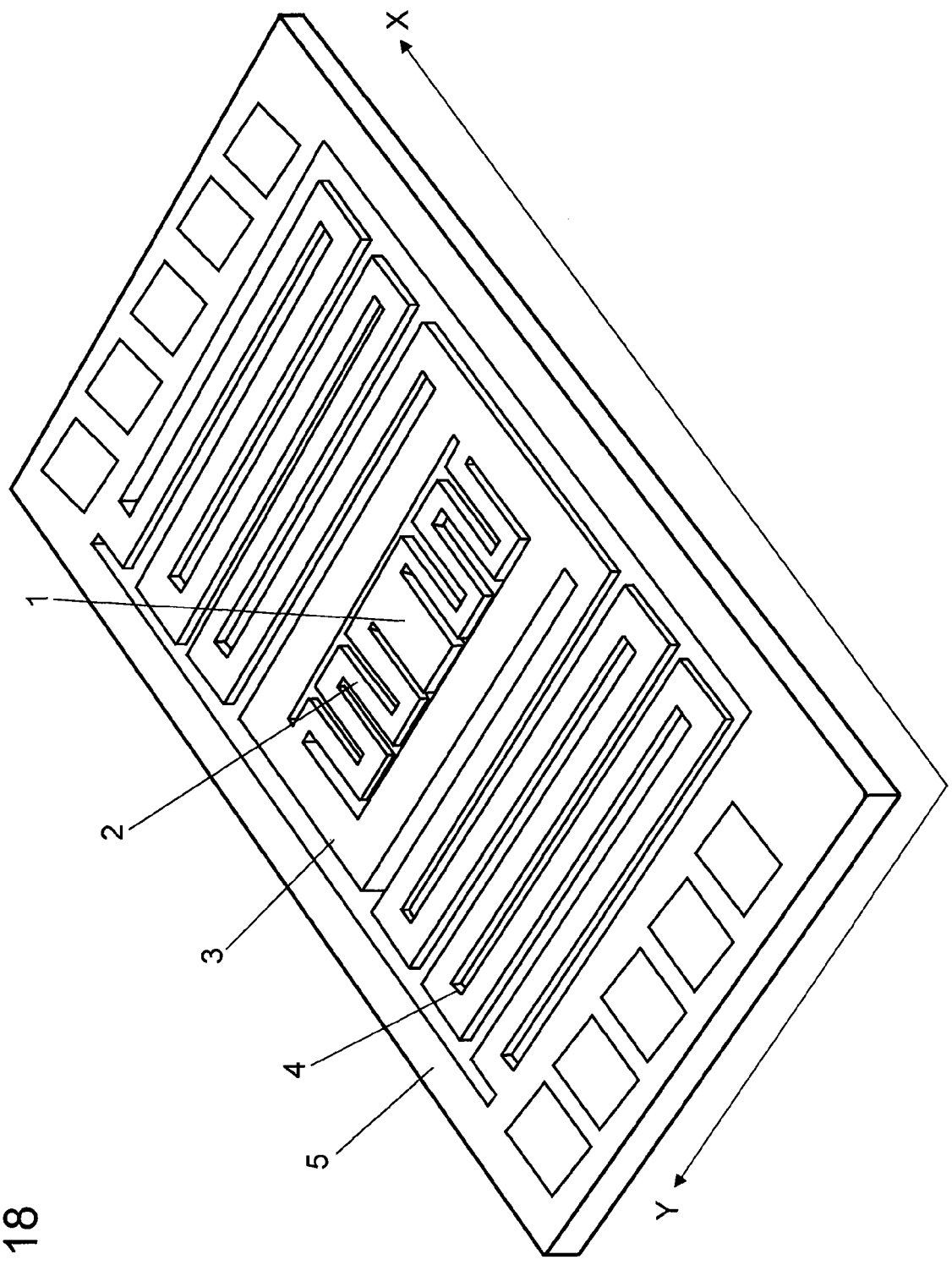
FIG. 18 is a perspective view of a conventional optical reflection element.

In short, the conventional optical reflection element does not seem to have been designed with any consideration given to the streamlining of the electrode pattern such that independent drive electrodes are patterned on each of oscillating portions 2 and 4 shown in FIG. 18 in order to drive them individually. It has therefore been necessary to form a wiring electrode routed for every one of these drive electrodes on the optical reflection element. That is, oscillating portion 4 has been required to bear at least wiring electrodes for both of the drive electrode of this oscillating portion 4 and the drive electrode of oscillating portion 2.

It becomes difficult to make patterning of the drive electrodes and the wiring electrodes when a number of these wiring electrodes increase. In the case of a small optical reflection element or when forming additional monitor electrodes, in particular, it becomes necessary to pattern a plural number of electrodes and their wiring electrodes in a small area, which makes the patterning task more difficult. When oscillating portions 7 and 9 have a complex meandering shape as shown in this exemplary embodiment, the patterning task of the electrodes, etc. becomes especially difficult, and this has been the cause of decreasing the productive efficiency.

In contrast to the above, this exemplary embodiment allows a single trace of drive electrode 18 to deliver a plurality of electric signals since they are combined. In other words, both of oscillating portions 7 and 9 can be driven with common drive electrode 18.

Since this exemplary embodiment also uses the wiring electrode common to drive electrodes 18 of both oscillating portions 7 and 9, it can decrease the number of wiring electrodes for drive electrodes 18 and hence improve the productivity.

Moreover, because the plurality of electric signals are combined after passing them through impedance elements 27 and 28, they can be combined easily even when there is a large difference in the frequencies between these electric signals.

According to this exemplary embodiment, it becomes possible to adjust lengths of the resonators to longer dimensions and increase a magnitude of the deflection of mirror 6 while achieving downsizing of the optical reflection element in its entirety by virtue of providing oscillating portions 7 and 9 of the meandering shape.

This exemplary embodiment can also enhance the magnitude of deflection of mirror 6 by the effect of making resonation of both oscillating portions 7 and 9.

Furthermore, since oscillating portions 7 are linked with the side portions of mirror 6 as shown in FIG. 1, this exemplary embodiment can make use of the leverage to rotate mirror 6 to a large degree around central axis S1. Likewise, it can rotate mirror 6 to a large degree around central axis S2 since oscillating portions 9 are linked with the lower side of frame body 8.

Moreover, because of the structure that oscillating portions 7 and 9 are linked with the side of mirror 6 and the side of frame body 8 respectively, the center of mirror 6 becomes the stationary point. This structure can hence suppress distortion of an image projected by the optical reflection element since optical lengths of the incident light and the reflected light are kept unchanged at the stationary point.

Figure 8:
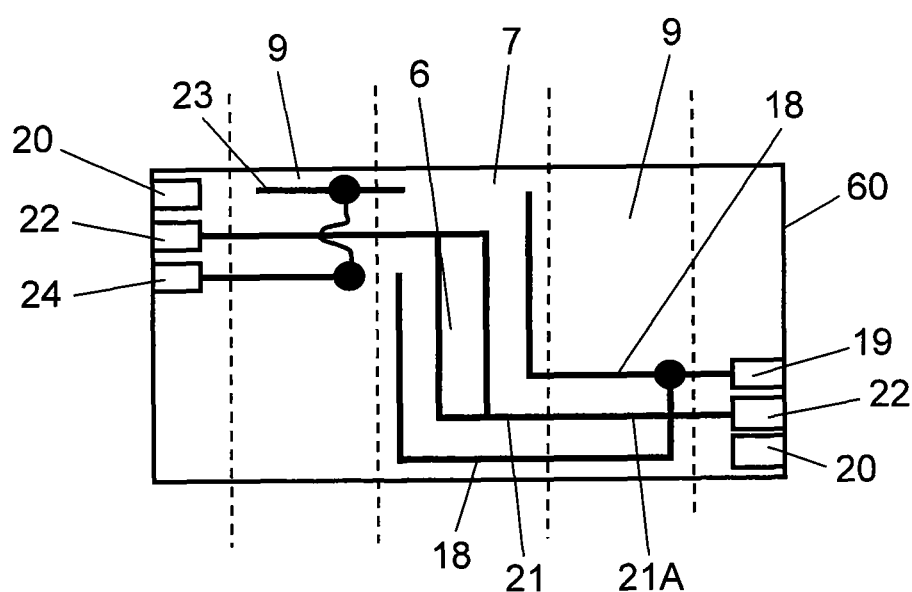
FIG. 8 is a schematic diagram showing another wiring pattern of the optical reflection element according to the same exemplary embodiment.

In this exemplary embodiment, although common drive electrode 18 is routed on both of the pair of oscillating portions 9 as shown in FIG. 6, it may be routed only on one of these oscillating portions 9 as illustrated in FIG. 8. Even in this case, the vibration exerted on one oscillating portion 9 (e.g., the one at the right side of mirror 6) travels to the other oscillating portion 9 (i.e., the one at the left side of mirror 6) through frame body 8 (see FIG. 1) to produce resonance, thereby generating vibration of both oscillating portions 9.

When drive electrode 18 is formed only on one of oscillating portions 9, it may be appropriate to form monitor electrode 23 for detecting amplitude of the vibration of oscillating portions 9 only on one of them on the left-hand side where drive electrode 18 is not routed, as shown in FIG. 8.

Figure 9:
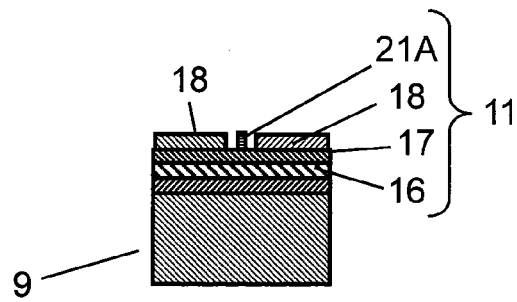
FIG. 9 is a sectional view of an oscillating portion showing the wiring pattern.

In this instance, oscillating portion 9 on the right-hand side where monitor electrode 23 is not routed needs to carry drive electrode 18 and wiring electrode 21A leading to monitor electrode 21 for oscillating portion 7. When this is the case, it is possible to divide common drive electrode 18 into two traces arranged symmetrically at both sides on each of oscillating blades 9A to 9E of oscillating portion 9, and dispose wiring electrode 21A for monitor electrode 21 in the center, as shown in FIG. 8 and FIG. 9. The divided traces of drive electrode 18 can be connected with a jumper wire or the like means as appropriate.

These traces of drive electrode 18 arranged in a symmetrical manner on the individual oscillating blades 9A to 9E uniformizes the voltage applied to oscillating portion 9 and ensures oscillating portion 9 to vibrate vertically.

It is also possible to divide monitor electrode 23 for detecting amplitude of oscillating portion 9 into two traces and arrange them symmetrically at both sides on each of oscillating blades 9A to 9E of oscillating portion 9 on the left-hand side as shown in FIG. 8. This arrangement makes use of the surface area of oscillating portion 9 effectively and improves the sensitivity of monitor electrode 23. The divided traces of monitor electrode 23 can be connected with a jumper wire or the like means as appropriate.

In this exemplary embodiment, although drive electrode 18 is routed on both of the pair of oscillating portions 7, it may be routed only on one of these oscillating portions 7. When this drive electrode 18 is oscillated, the resonant vibration can travel to the other oscillating portion 7 through mirror 6 and it thereby produces vibration of the other oscillating portion 9. The above structure can hence decrease the number of wiring electrodes for drive electrodes 18 on oscillating portions 7.

Second Exemplary Embodiment

Figure 10:
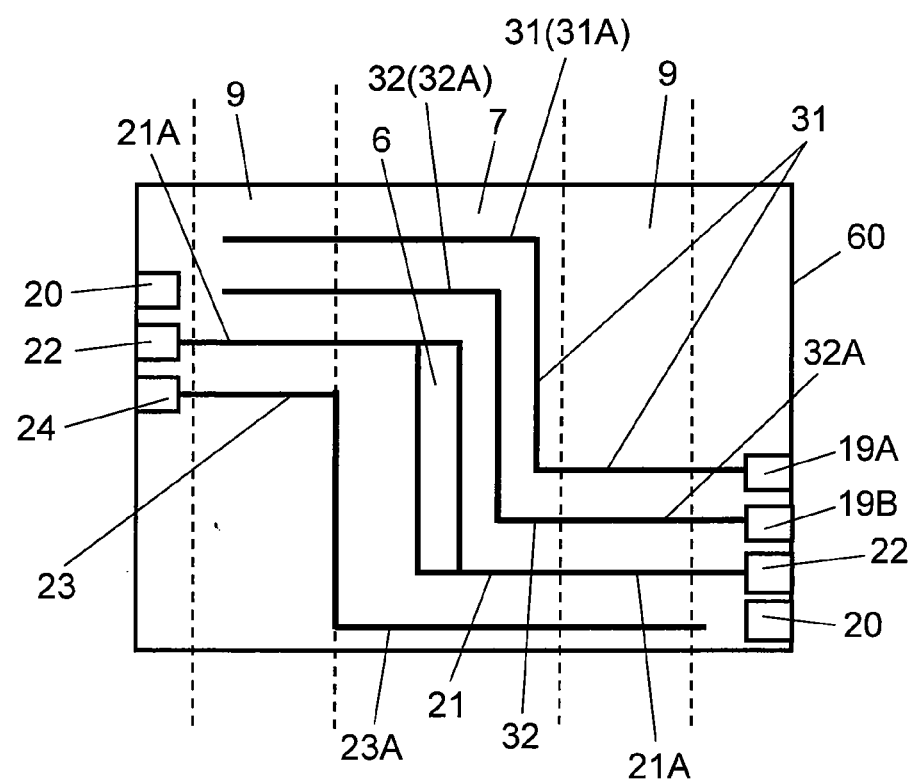
FIG. 10 is a schematic diagram showing a wiring pattern of an optical reflection element according to a second exemplary embodiment of the present invention.

FIG. 10 is a diagram showing schematically an electrode pattern of an optical reflection element according to the second exemplary embodiment of the present invention. This exemplary embodiment differs from the first exemplary embodiment in respect mainly of that oscillating portion 7 is provided with two electrically independent drive electrodes 31 and 32 as shown in FIG. 10. Alternating voltages of opposite phases, or positive and negative potentials, are applied individually to drive electrodes 31 and 32 through respective external electrodes 19A and 19B.

Figure 11:
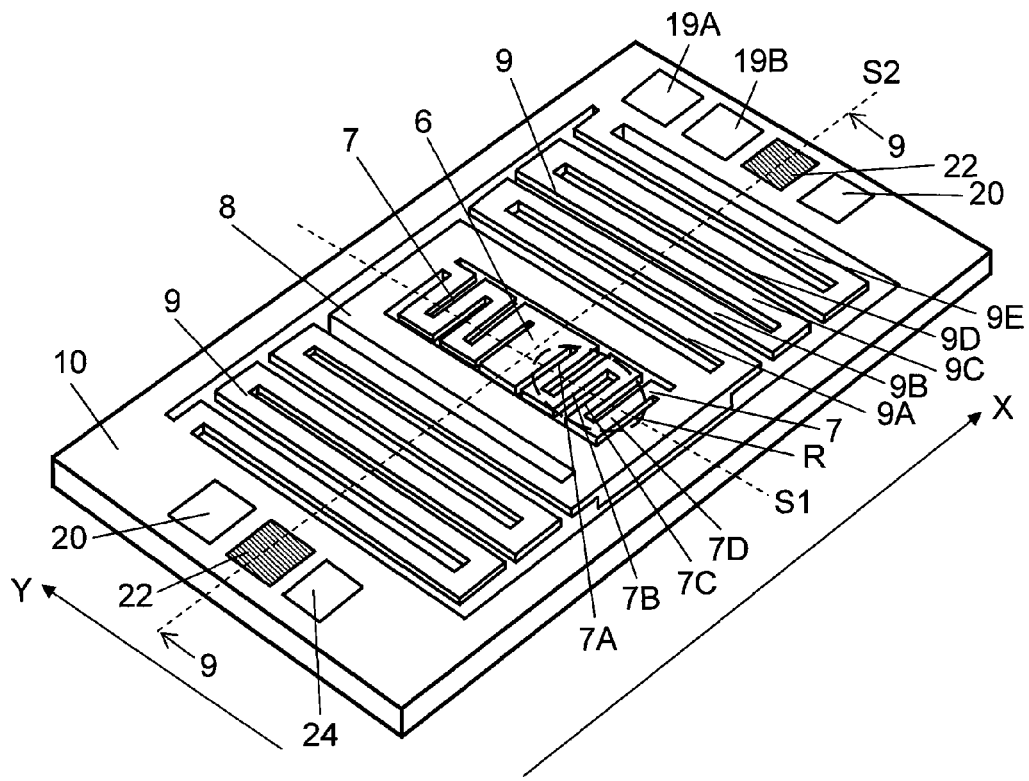
FIG. 11 is a perspective view of the optical reflection element according to the same exemplary embodiment.
Figure 12:
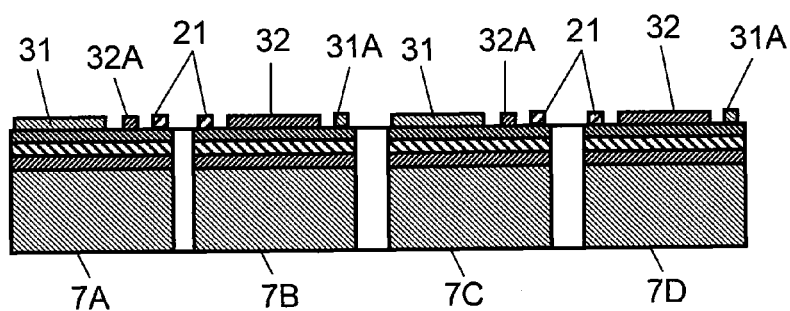
FIG. 12 is a sectional view of a portion marked R in FIG. 11.

FIG. 11 is a perspective view showing the optical reflection element of this exemplary embodiment, and FIG. 12 is a sectional view of a portion marked R in FIG. 11. According to this exemplary embodiment, two electrically independent drive electrodes 31 and 32 are disposed alternately on a plurality of oscillating blades 7A to 7D of oscillating portion 7 as shown in FIG. 10 to FIG. 12. There are also two electrically independent wiring electrodes 31A and 32A disposed in the same alternate manner on the plurality of oscillating blades 7A to 7D for connecting these drive electrodes 31 and 32 together.

In other words, wiring electrode 32A of a small width for drive electrode 32 is routed on each of oscillating blades 7A and 7C of oscillating portion 7 where drive electrode 31 is disposed as shown in FIG. 12. Likewise, wiring electrode 31A of a small width for drive electrode 31 is routed on each of oscillating blades 7B and 7D where drive electrode 32 is disposed.

Figure 13:
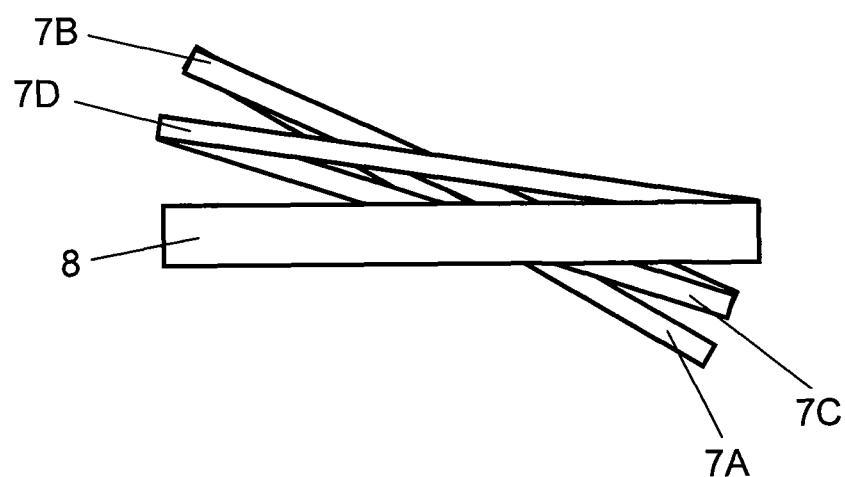
FIG. 13 is a diagrammatic illustration showing a state of oscillation of the optical reflection element according to the same exemplary embodiment.

When drive electrodes 31 and 32 are disposed alternately and ac voltages of opposite positive/negative phases are applied to them, the individual oscillating blades 7A to 7D deflect alternately in the directions opposite to one another, and a magnitude of oscillation resulting from their deflections is multiplied, as a state of which oscillation is illustrated in FIG. 13. Oscillating portion 7 as a whole can thus make a large magnitude of reciprocatory turning motion about central axis S1, and increase a degree of the deflection (amplitude) of mirror 6.

According to this exemplary embodiment, as shown in FIG. 10, common drive electrode 31 is disposed on each of oscillating blades 9A to 9E (refer to FIG. 11) of oscillating portion 9 in the same manner as that of the first exemplary embodiment.

That is, drive electrode 31 on one side is used as drive electrode 31 common to both piezoelectric elements of oscillating portions 7 and 9, and drive electrode 32 on the other side is used as drive electrode 32 for only the piezoelectric element of oscillating portion 7, according to this exemplary embodiment. Oscillating portion 9 therefore bears wiring electrode 32A leading to drive electrode 32 besides drive electrode 31 as it is routed on the individual oscillating blades 9A to 9E. Monitor electrode 21 of this exemplary embodiment is formed narrower in width than that of the first exemplary embodiment since oscillating portion 7 has two drive electrodes 31 and 32 formed thereon.

In this exemplary embodiment, wiring electrode 21A for monitor electrode 21 formed on oscillating portion 9 is also narrower in width than that of the first exemplary embodiment since monitor electrode 21 of oscillating portion 7 is routed from external electrode 22 to oscillating portion 7 through oscillating portion 9. In addition, monitor electrode 23 of oscillating portion 9 is routed from external electrode 24 to each oscillating portion 9. It is also feasible to route the wiring electrode for monitor electrode 23 through frame body 8 to each of the pair of oscillating portions 9 instead of routing it on the surface of oscillating portion 7.

Since an electric signal input to drive electrode 31 comprises a combination of two resonance frequency signals for oscillating portions 7 and 9, this exemplary embodiment can use drive electrode 31 of a single trace common to both oscillating portions 7 and 9 and decrease a number of the wiring electrodes.

When the optical reflection element of this exemplary embodiment is used for an image projection device, it becomes necessary in general to increase a scanning speed substantially greater in the direction of X-axis than a scanning speed in the direction of Y-axis in order to project an image of high definition.

Though the requirement in this case can be met by increasing the frequency for driving oscillating portion 7 to oscillate in the direction of X-axis, the magnitude of deflection of mirror 6 becomes smaller the higher the frequency becomes. It is for this reason that this exemplary embodiment has two drive electrodes 31 and 32 disposed alternately on oscillating blades 7A to 7D of oscillating portion 7, and the ac voltages of opposite phases are applied individually to drive electrodes 31 and 32 to multiply their deflections and obtain a large magnitude. In addition, since this exemplary embodiment also uses drive electrode 31 common to both oscillating portions 7 and 9, it can avoid increasing the number of wiring electrodes as in the case of the conventional art, thereby improving the productivity of the high-performance optical reflection element.

Description of other advantages similar to those of the first exemplary embodiment will be omitted as they are attributed to the same structure as the first exemplary embodiment.

Third Exemplary Embodiment

Figure 14:
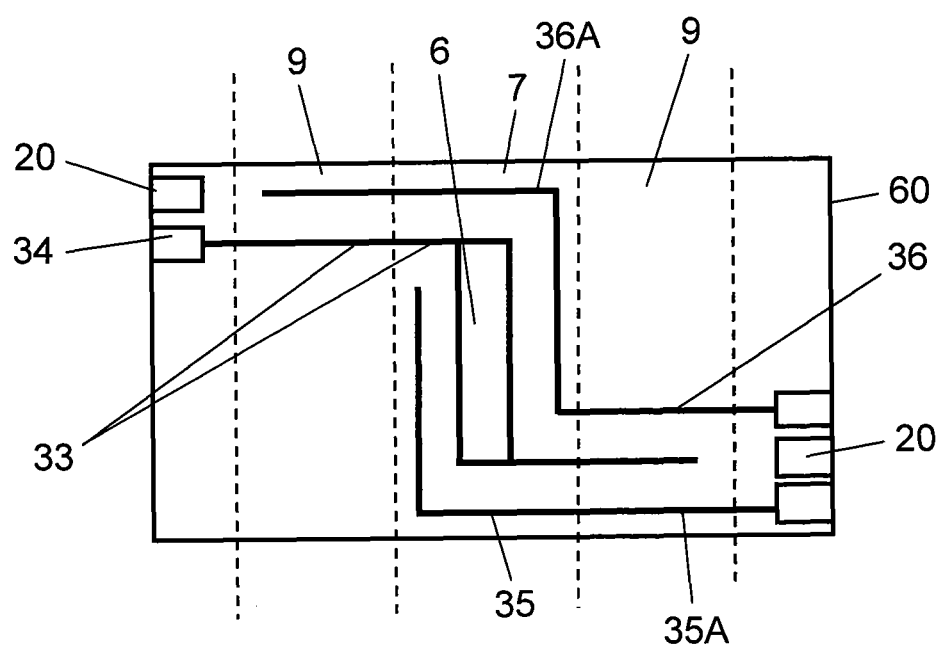
FIG. 14 is a schematic diagram showing a wiring pattern of an optical reflection element according to a third exemplary embodiment of the present invention.

FIG. 14 is a diagram showing schematically an electrode pattern of an optical reflection element according to the third exemplary embodiment of the present invention. This exemplary embodiment differs from the first exemplary embodiment in respect of that monitor elements of oscillating portions 7 and 9 share common monitor electrode 33 as shown in FIG. 14, and monitor electrode 33 is tapped from external electrode 34 to the outside by way of common wiring electrode 33A as shown in FIG. 15.

Drive electrode 35 for driving piezoelectric element 11 of oscillating portion 7 and drive electrode 36 for driving the piezoelectric element of oscillating portion 9 are formed separately in this exemplary embodiment, so that they are made electrically independent of each other. Wiring electrodes 35A and 36A for respective drive electrodes 35 and 36 are therefore routed separately.

Figure 15:
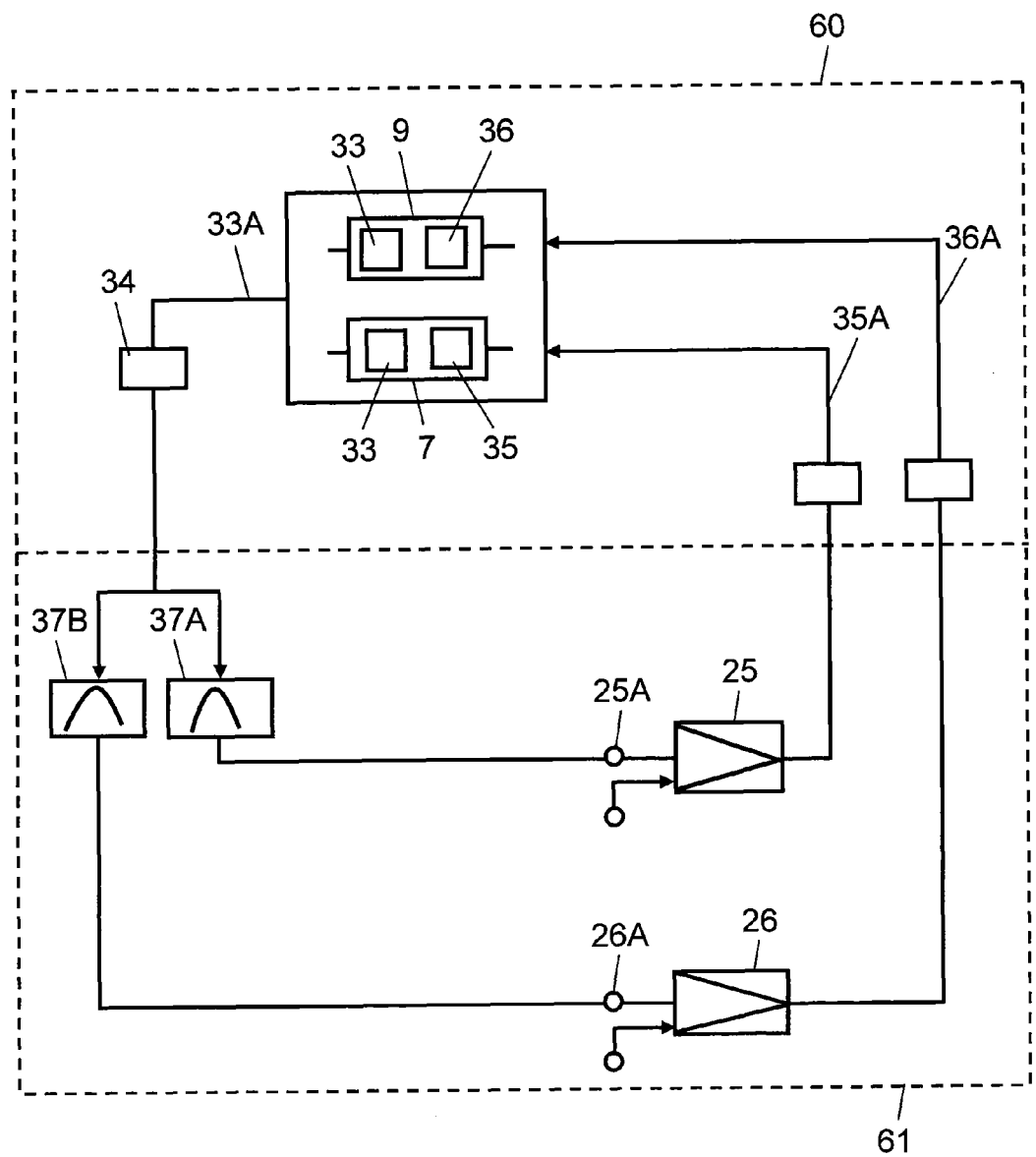
FIG. 15 is a block diagram showing a configuration of a piezoelectric driver according to the same exemplary embodiment.

According to this exemplary embodiment, common monitor electrode 33 detects an electric signal generated by vibration of the piezoelectric element of oscillating portion 7 and another electric signal generated by vibration of the piezoelectric element of oscillating portion 9, so that the both electric signals are carried in a combined mode as shown in FIG. 15. The combined electric signal from external electrode 34 is passed through filter 37A to obtain only the electric signal generated in oscillating portion 7. The combined electric signal is also passed through filter 37B to obtain only the electric signal generated in oscillating portion 9. The electric signals detected by common monitor electrode 33 can hence be separated into the individual electric signals according to this exemplary embodiment.

Accordingly, this exemplary embodiment can replace the two electrically independent monitor electrodes otherwise needed in the conventional art by the single common electrode, which can be tapped out through wiring electrode 33A. In other words, this exemplary embodiment can reduce the number of wiring electrodes, and it thereby simplifying the patterning task and improving the productive efficiency.

In the exemplary embodiment described above, drive electrodes 35 and 36 may be used in common to both oscillating portions 7 and 9 although they are shown here as separate electrodes. This can further decrease the number of wiring electrodes necessary for drive electrodes 35 and 36.

It is also desirable, as another example of this exemplary embodiment, that a common drive electrode is formed for both of oscillating portion 7 at one side (e.g., one of oscillating portion 7 at the lower-hand side in FIG. 1) and oscillating portion 9 at one side (e.g., one of oscillating portion 9 at the right-hand side in FIG. 1) and a common monitor electrode is formed for both of oscillating portion 7 at the other side (e.g., the other oscillating portion 7 at the upper-hand side in FIG. 1) and oscillating portion 9 at the other side (e.g., the other oscillating portion 9 at the left-hand side in FIG. 1).

This further eases the patterning task since all what is needed is to form the drive electrode on oscillating portions 7 and 9 at one side and the monitor electrode on oscillating portions 7 and 9 at the other side. It is also possible, on the contrary, to form the monitor electrode on oscillating portions 7 and 9 at one side and the drive electrode on oscillating portions 7 and 9 at the other side.

Description of other advantages similar to those of the first exemplary embodiment will be omitted as they are attributed to the same structure as the first exemplary embodiment.

Fourth Exemplary Embodiment

Figure 16:
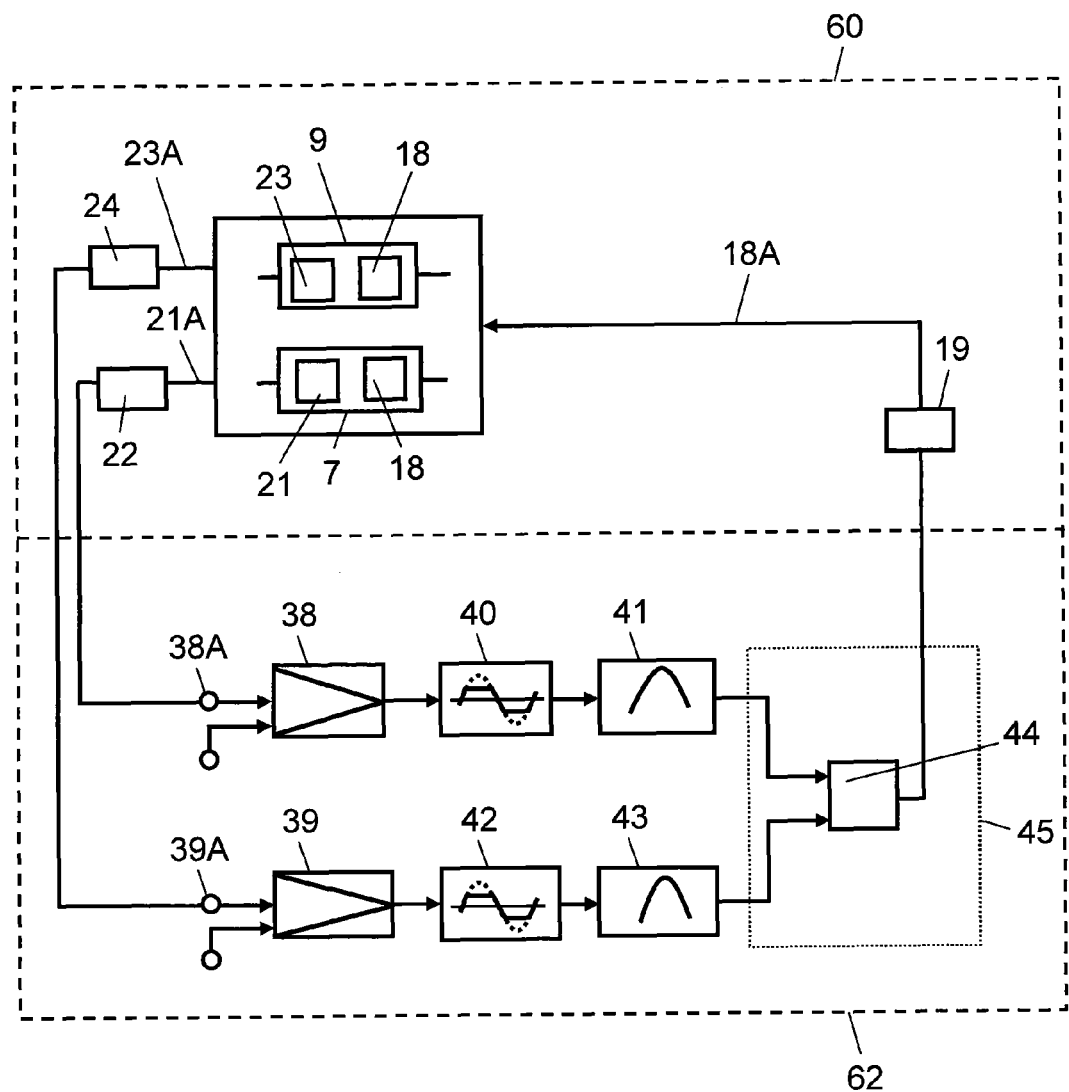
FIG. 16 is a block diagram showing a configuration of a piezoelectric driver according to a fourth exemplary embodiment of the present invention.

FIG. 16 is a block diagram showing a configuration of a piezoelectric driver according to the fourth exemplary embodiment of the present invention. This exemplary embodiment differs from the first exemplary embodiment in respect of that the piezoelectric driver is provided with a combiner circuit for combining electric signals.

As shown in FIG. 16, drive controller unit 62 of this exemplary embodiment comprises two preamplifiers ("first preamplifier" and "second preamplifier") 38 and 39 arranged in parallel. Preamplifier 38 is electrically connected to saturation amplifier ("first saturation amplifier") 40, which in turn is connected electrically to band-pass filter ("first band-pass filter) 41, from which a resonance driving signal ("first electric signal") for oscillating portion 7 is tapped out.

Likewise, preamplifier 39 is electrically connected to saturation amplifier ("second saturation amplifier") 42, which in turn is connected electrically to band-pass filter ("second band-pass filter) 43, from which another resonance driving signal ("second electric signal") for oscillating portion 9 is tapped out.

Saturation amplifiers 40 and 42 can be comprised of any such types as a saturated amplifier that maintains output to a predetermined value when the output reaches that value, a negative saturated amplifier that starts attenuating output after the output reaches a predetermined value, and the like.

These resonance driving signals passed through and output from the combination of saturation amplifier 40 and band-pass filter 41 and the other combination of saturation amplifier 42 and band-pass filter 43 are combined inside adder-combiner circuit 45 comprising adder 44 and the like. A signal output from adder-combiner circuit 45 is fed to external electrode 19, routed inside optical reflection element 60, and input to drive electrode 18 common to both oscillating portions 7 and 9.

This exemplary embodiment also comprises a feedback circuit for returning to preamplifier 38 the electric signal generated by vibration of oscillating portion 7 and detected by monitor electrode 21. Here, a driving frequency of oscillating portion 7 and a passing band frequency of band-pass filter 41 are set in this exemplary embodiment to keep a closed-loop gain of not less than 1 for this feedback circuit so that the signal output from monitor electrode 21 is not attenuated to a level lower than the signal input to preamplifier 38. Note that the number of electric signals to be combined with adder-combiner circuit 45 here can be three or more.

In a manner similar to oscillating portion 7, the electric signal generated by vibration of oscillating portion 9 and detected by monitor electrode 23 is returned to preamplifier 39. A driving frequency of oscillating portion 9 and a passing band frequency of band-pass filter 43 are also set in this exemplary embodiment so that a closed-loop gain of the feedback circuit becomes not less than 1.

Description is provided next of a method of driving the optical reflection element according to this exemplary embodiment. When an electric signal (i.e., an ac voltage) for driving oscillating portion 7 is input to input terminal 38A of preamplifier 38 shown in FIG. 16, the signal is amplified by preamplifier 38. The signal amplified by preamplifier 38 is then input to saturation amplifier 40, and corrected to a signal of a predetermined level. The signal output from saturation amplifier 40 is input to band-pass filter 41, which produces a resonance driving signal for oscillating portion 7.

In the like manner, another electric signal (i.e., an ac voltage) for driving oscillating portion 9 is input to input terminal 39A of preamplifier 39 and amplified. The amplified signal is corrected by saturation amplifier 42, input to band-pass filter 43, which then produces a resonance driving signal for oscillating portion 9.

These resonance driving signals tapped out of oscillating portions 7 and 9 are combined by adder-combiner circuit 45. The combined electric signal is fed to optical reflection element 60 through external electrode 19, supplied to drive electrode 18, and it drives both oscillating portions 9 and 7 at the same time.

Moreover, monitor electrode 21 detects a voltage responsive to a magnitude of the vibration of oscillating portion 7, and this electric signal is tapped out from external electrode 22 as shown in FIG. 16. On the other hand, monitor electrode 23 detects another voltage responsive to a magnitude of the vibration of oscillating portion 9, and the electric signal is tapped out from external electrode 24. These electric signals tapped out from external electrodes 22 and 24 are returned to preamplifiers 38 and 39 respectively.

In this instance, it is desirable to keep a phase shift of the applied driving frequency within a range no larger than ±70 degrees in order to drive oscillating portion 7 or 9 of optical reflection element 60 to resonate by following the respective signal.

For the above reason, band-pass filter 41 is so adjusted that its passing band is in a frequency band corresponding to the range of ±70 degrees or less in phase for oscillating portion 7 of this exemplary embodiment. Likewise, band-pass filter 43 is so adjusted that its passing band is in a frequency band corresponding to the range of ±70 degrees or less in phase for oscillating portion 9.

It is also desirable in this exemplary embodiment to include additional means of controlling the individual signals input to adder-combiner circuit 45 to maintain the predetermined values by using any of monitor electrodes 21 and 23 to detect and determine whether oscillating portions 7 and 9 are driven within the phase range of ±70 degrees.

Like the first exemplary embodiment, this embodiment can also reduce the number of electrode traces of drive electrodes 18 and simplify the wiring pattern.

In addition, since all of preamplifiers 38 and 39, saturation amplifiers 40 and 42, band-pass filters 41 and 43 and adder-combiner circuit 45 in this exemplary embodiment consist of active components, they can be integrated into an IC chip to streamline the process of mounting.

In this exemplary embodiment, although both oscillating portions 7 and 9 are provided with common drive electrodes 18 formed on their individual oscillating blades (7A to 7D and 9A to 9E in FIG. 1), common drive electrodes 18 may be formed only on one side of oscillating portion 7 or oscillating portion 9, or two kinds of drive electrodes may be formed alternately on both sides of the oscillating blades. When this is the case, application of the ac voltages of opposite positive/negative phases to the individual drive electrodes can multiply their deflections and obtain a large magnitude of oscillation as explained in the second exemplary embodiment.

Moreover, although drive electrodes 18 are shown as being formed on the individual oscillating blades of oscillating portions 7 and 9, this exemplary embodiment is not intended to limit the areas where drive electrodes 18 are formed, but for instance, they can be formed only on some of the oscillating blades of oscillating portions 7 and 9.

Figure 17:
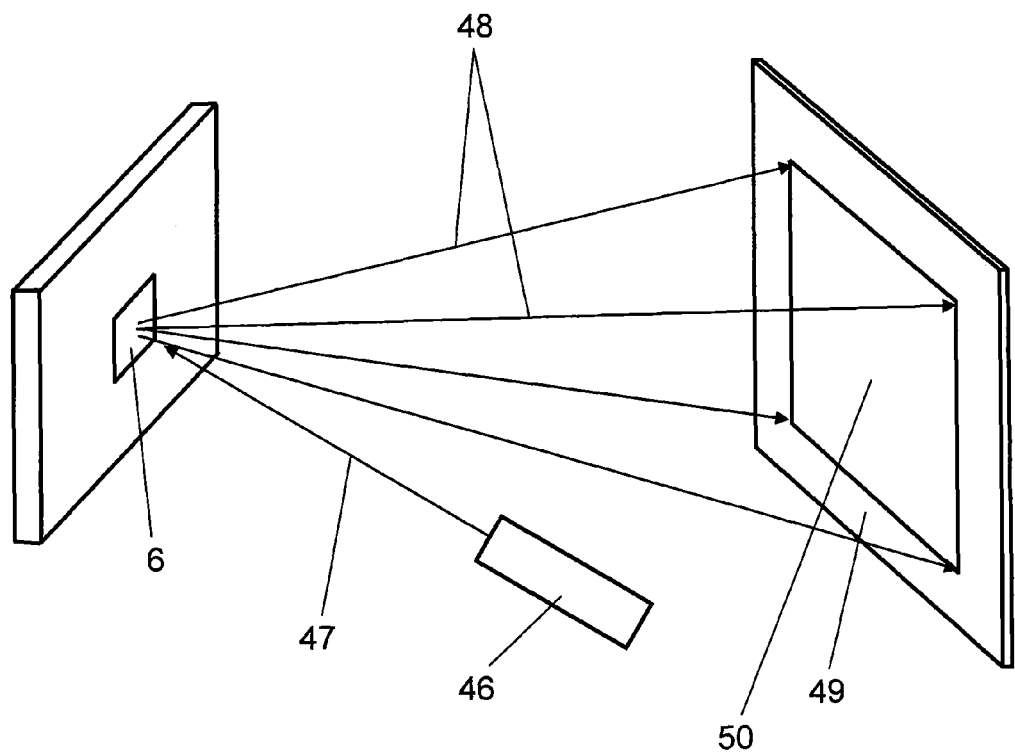
FIG. 17 is a block diagram of an image projection device using the optical reflection element according to the same exemplary embodiment.

FIG. 17 is a block diagram showing an image projection device using the optical reflection element of this exemplary embodiment. As shown in FIG. 17, the image projection device of this exemplary embodiment comprises light source 46 such as a laser irradiator, optical reflection element 60 and screen 49.

According to this configuration, incident light 47 of light source 46 enters on mirror 6 of optical reflection element 60, and reflected light 48 from mirror 6 projects onto screen 49. Image 50, characters and the like can be projected on screen 49, or a wall, when reflected light 48 is scanned in the directions of X- and Y-axes by vibrating mirror 6 under this condition.

In the optical reflection elements of the first to the fourth exemplary embodiments, though oscillating portions 7 and 9 have been illustrated as having the meandering shape, they are illustrative and not restrictive such that they can be of any other shape as a cantilever shape and a crisscross shape.

Furthermore, in any of the first to the fourth exemplary embodiments, the piezoelectric actuators comprised of oscillating portions 7 and 9 are linked with mirror 6 and used as the optical reflection element. However, the piezoelectric actuators may be linked with a light-emitting element instead of the mirror, so that it can be used as an optical device.

INDUSTRIAL APPLICABILITY

An optical reflection element of the present invention helps ease the process of forming wiring electrodes even on an oscillating portion of complex shape by virtue of necessitating a small number of the electrodes, and is therefore useful for application in a small size image projection device such as a small projector, head up display and head-mounted display.

The invention claimed is:

1. A piezoelectric actuator comprising:
a first oscillating portion provided with a first piezoelectric element having a first drive electrode; and
a second oscillating portion having a central axis different from that of the first oscillating portion and provided with a second piezoelectric element having a second drive electrode, wherein the first drive electrode and the second drive electrode are connected together.

2. An optical reflection element comprising the piezoelectric actuator of claim 1, and a mirror linked with any of the first oscillating portion and the second oscillating portion.

3. The optical reflection element of claim 2 having the mirror linked with the first oscillating portion, the optical reflection element further comprising:
a frame body linked with the first oscillating portion and surrounding the perimeter of the first oscillating portion and the mirror; and
a support base linked with the frame body through the second oscillating portion.

4. A piezoelectric driver comprising:
a first oscillating portion provided with a first piezoelectric element having a first drive electrode; and
a second oscillating portion having a central axis different from that of the first oscillating portion and provided with a second piezoelectric element having a second drive electrode, wherein
the first drive electrode and the second drive electrode are connected together, and a composite electric signal of at least two electric signals is supplied to the connected drive electrodes.

5. The piezoelectric driver of claim 4, wherein the composite electric signal of at least two electric signals includes a first electric signal for driving the first oscillating portion and a second electric signal for driving the second oscillating portion, passed through respective impedance elements before being combined into the composite electric signal.

6. The piezoelectric driver of claim 4, further comprising:
a first saturation amplifier connected with a first preamplifier for receiving a first electric signal for driving the first oscillating portion;
a first band-pass filter connected with the first saturation amplifier;
a second saturation amplifier connected with a second preamplifier for receiving a second electric signal for driving the second oscillating portion;
a second band-pass filter connected with the second saturation amplifier; and
a combiner circuit for combining outputs of the first band-pass filter and the second band-pass filter, wherein
the composite electric signal of at least two electric signals is supplied from the combiner circuit.

* * * * *